US012581620B2

(12) United States Patent
Mukundan et al.

(10) Patent No.: US 12,581,620 B2
(45) Date of Patent: Mar. 17, 2026

(54) EXIT CHANNEL CONFIGURATION FOR MEMS-BASED ACTUATOR SYSTEMS

(71) Applicant: Frore Systems Inc., San Jose, CA (US)

(72) Inventors: Vikram Mukundan, San Ramon, CA (US); Ananth Saran Yalamarthy, Stanford, CA (US); Suryaprakash Ganti, Los Altos, CA (US); Seshagiri Rao Madhavapeddy, La Jolla, CA (US); Prabhu Sathyamurthy, San Jose, CA (US)

(73) Assignee: Frore Systems Inc., San Jose, CA (US)

( * ) Notice: Subject to any disclaimer, the term of this patent is extended or adjusted under 35 U.S.C. 154(b) by 427 days.

(21) Appl. No.: 17/862,185

(22) Filed: Jul. 11, 2022

(65) Prior Publication Data

US 2023/0016991 A1 Jan. 19, 2023

Related U.S. Application Data

(60) Provisional application No. 63/353,490, filed on Jun. 17, 2022, provisional application No. 63/220,862, filed on Jul. 12, 2021.

(51) Int. Cl.
*H05K 7/20* (2006.01)

(52) U.S. Cl.
CPC .................................. *H05K 7/20272* (2013.01)

(58) Field of Classification Search
CPC . H05K 7/20272; F04B 43/095; F04B 43/046; F04B 17/003; H10N 30/306; H01L 23/467; H01L 23/4336
See application file for complete search history.

(56) References Cited

U.S. PATENT DOCUMENTS

| | | | |
|---|---|---|---|
| 7,031,155 B2 | 4/2006 | Sauciuc | |
| 7,282,837 B2 | 10/2007 | Scher | |
| 8,721,303 B2 | 5/2014 | Fujisaki | |
| 9,252,069 B2 * | 2/2016 | Bhunia | H01L 23/3735 |
| 10,480,502 B2 * | 11/2019 | Hirata | F04B 45/047 |
| 11,464,140 B2 * | 10/2022 | Yalamarthy | H05K 7/20509 |
| 11,510,341 B2 | 11/2022 | Mukundan | |
| 11,796,262 B2 | 10/2023 | Mukundan | |
| 11,978,690 B2 | 5/2024 | Mukundan | |

(Continued)

FOREIGN PATENT DOCUMENTS

| | | |
|---|---|---|
| CN | 116792301 | 9/2023 |
| JP | 2006007560 | 1/2006 |

*Primary Examiner* — Tho V Duong
(74) *Attorney, Agent, or Firm* — Van Pelt, Yi & James LLP

(57) ABSTRACT

A cooling system including a support structure, a cooling element, and a bottom plate is described. The cooling element has a central region and a perimeter. The cooling element is supported by the support structure at the central region. At least a portion of the perimeter is unpinned. The cooling element undergoes vibrational motion when actuated to drive a fluid toward a heat-generating structure. The bottom plate has orifices and at least one cavity therein. The at least one cavity is adjacent to and fluidically connected with the orifices. The at least one cavity and the orifices define an orifice distance between the orifices and the heat-generating structure and an orifice length within the bottom plate. The heat-generating structure and the bottom plate define a gap between a portion of the bottom plate and a portion of the heat-generating structure.

20 Claims, 10 Drawing Sheets

400A

(56) References Cited

U.S. PATENT DOCUMENTS

| | | | | |
|---|---|---|---|---|
| 12,025,116 | B2 | 7/2024 | Kodama | |
| 2005/0089415 | A1* | 4/2005 | Cho | F04B 45/047 |
| | | | | 417/413.1 |
| 2005/0225213 | A1 | 10/2005 | Richards | |
| 2006/0138905 | A1 | 6/2006 | Gonzales | |
| 2008/0217764 | A1 | 9/2008 | Campini | |
| 2008/0304979 | A1 | 12/2008 | Lucas | |
| 2011/0063800 | A1 | 3/2011 | Park | |
| 2011/0076170 | A1* | 3/2011 | Fujisaki | F04B 45/047 |
| | | | | 417/415 |
| 2013/0301218 | A1 | 11/2013 | Li | |
| 2015/0155221 | A1 | 6/2015 | Chen | |
| 2017/0138357 | A1* | 5/2017 | Kondo | F04B 45/047 |
| 2017/0218936 | A1* | 8/2017 | Chen | F04B 43/046 |
| 2017/0292537 | A1 | 10/2017 | Barak | |
| 2018/0187672 | A1* | 7/2018 | Tanaka | F04B 45/04 |
| 2019/0101938 | A1 | 4/2019 | Mou | |
| 2020/0236470 | A1 | 7/2020 | Cerini | |
| 2020/0318629 | A1 | 10/2020 | Fujisaki | |
| 2021/0010467 | A1 | 1/2021 | Fujisaki | |
| 2021/0176895 | A1 | 6/2021 | Mukundan | |
| 2021/0180723 | A1 | 6/2021 | Mukundan | |
| 2021/0183739 | A1 | 6/2021 | Sathyamurthy | |
| 2021/0185853 | A1 | 6/2021 | Ganti | |
| 2021/0185856 | A1 | 6/2021 | Ganti | |
| 2022/0110220 | A1 | 4/2022 | Yalamarthy | |
| 2022/0260068 | A1 | 8/2022 | Kodama | |
| 2023/0121697 | A1 | 4/2023 | Bussmann | |
| 2023/0287904 | A1 | 9/2023 | Hatfield | |
| 2025/0268106 | A1 | 8/2025 | Vikram | |

* cited by examiner

100

100

100

100

100

100

120'

200

200

300

300

300

300

300

400C

400D

500A

500B

600

EXIT CHANNEL CONFIGURATION FOR MEMS-BASED ACTUATOR SYSTEMS

CROSS REFERENCE TO OTHER APPLICATIONS

This application claims priority to U.S. Provisional Patent Application No. 63/220,862 entitled PIEZOELECTRIC ACTIVE MEMS COOLING SYSTEMS INCLUDING ENGINEERED ACTUATORS, TAILORED ORIFICES, CONTROLLED GAPS, AND STRIP LEVEL MANUFAC-TURING filed Jul. 12, 2021 and U.S. Provisional Patent Application No. 63/353,490 entitled MEMS VIBRA-TIONAL COOLING SYSTEM HAVING AN INTE-GRATED SPOUT AND A GRAPHITE COVER filed Jun. 17, 2022, both of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorpo-rating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying draw-ings.

DETAILED DESCRIPTION

Figure 1A:
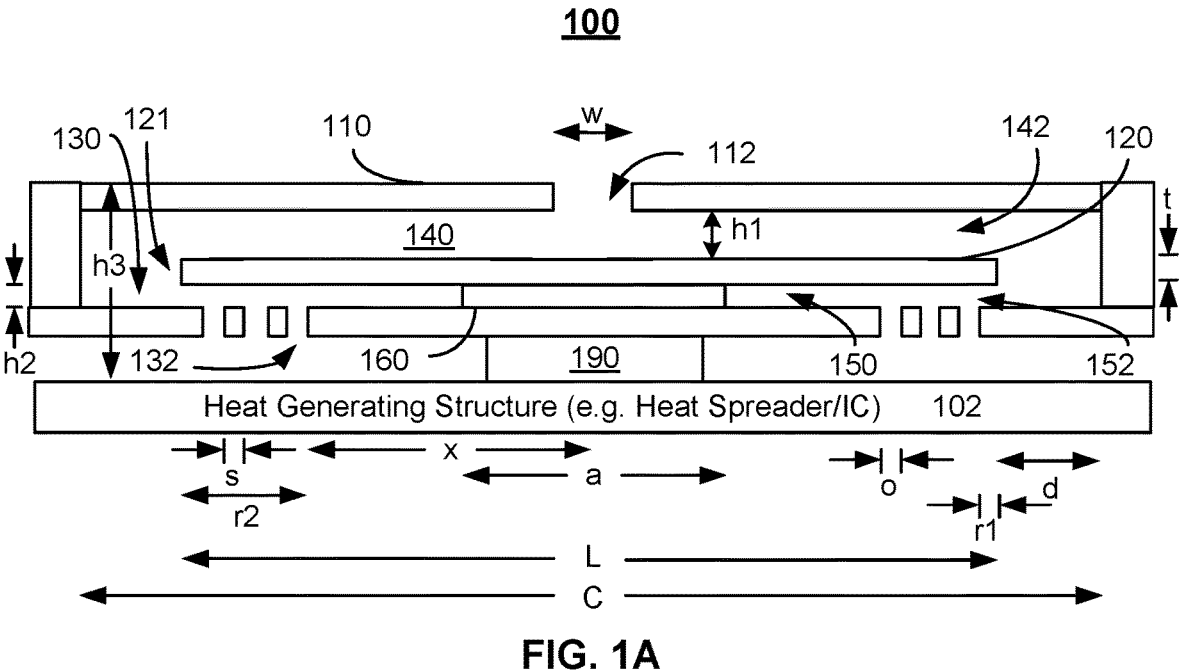
FIGS. 1A-1G depict an embodiment of an active MEMS cooling system including a centrally anchored cooling ele-ment.

The invention can be implemented in numerous ways, including as a process; an apparatus; a system; a composi-tion of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as tech-niques. In general, the order of the steps of disclosed processes may be altered within the scope of the invention. Unless stated otherwise, a component such as a processor or a memory described as being configured to perform a task may be implemented as a general component that is tem-porarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying fig-ures that illustrate the principles of the invention. The invention is described in connection with such embodi-ments, but the invention is not limited to any embodiment. The scope of the invention is limited only by the claims and the invention encompasses numerous alternatives, modifi-cations and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smart-phones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling sys-tems. Active cooling systems are those in which an electrical signal is used to drive cooling. An electric fan that has rotating blades is an example of an active cooling system, while a heat sink is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components, because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particu-larly for mobile devices. Consequently, active cooling sys-tems face particular challenges when used in computing devices such as active computing devices. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions are desired.

A cooling system including a support structure, a cooling element, and a bottom plate is described. The cooling element has a central region and a perimeter. The cooling element is supported by the support structure at the central region. At least a portion of the perimeter is unpinned. The cooling element undergoes vibrational motion when actuated to drive a fluid toward a heat-generating structure. The bottom plate has orifices and at least one cavity therein. The at least one cavity is adjacent to and fluidically connected with the orifices. The at least one cavity and the orifices define an orifice distance between the orifices and the heat-generating structure and an orifice length within the bottom plate. In some embodiments, the orifice distance is at least two hundred micrometers. The orifice length may be at least one hundred and fifty micrometers and not more than three hundred micrometers. The heat-generating structure and the bottom plate define a gap between a portion of the bottom plate and a portion of the heat-generating structure. In some embodiments, the gap is at least two hundred microns and not more than five hundred microns high. In some such embodiments, the gap is at least three hundred and fifty microns and not more than four hundred and fifty hundred microns high.

In some embodiments, the cavity/cavities include a first cavity on a first side of the orifices and/or a second cavity on a second side of the orifices. The first cavity is further from the heat-generating structure than the orifices. The second cavity is closer to the heat-generating structure than the orifices. The bottom plate may include or consist of a material having low internal losses. For example, the material may include at least one of Al7075, Al6063, Ti64, Ti Grade 2, Ti Grade 9, a beryllium-copper alloy, Monel, aluminum bronze, aluminum, SUS 304, or SUS316. In some embodiments, the bottom plate includes an orifice plate and a jet channel plate. The jet channel plate is between the orifice plate and the heat-generating structure. The heat-generating structure may have a depression therein. In such embodiments, the orifice distance includes a height of the depression.

In some embodiments the cooling system includes a plurality of cooling cells. Each cell may include the support structure, cooling element, bottom plates, and/or other structures described herein. A method of cooling a heat-generating structure is also described. In some embodiments, the method includes driving cooling element(s) in the systems described herein. In some such embodiments, the cooling element(s) are driven at or near resonance.

Figure 1B:
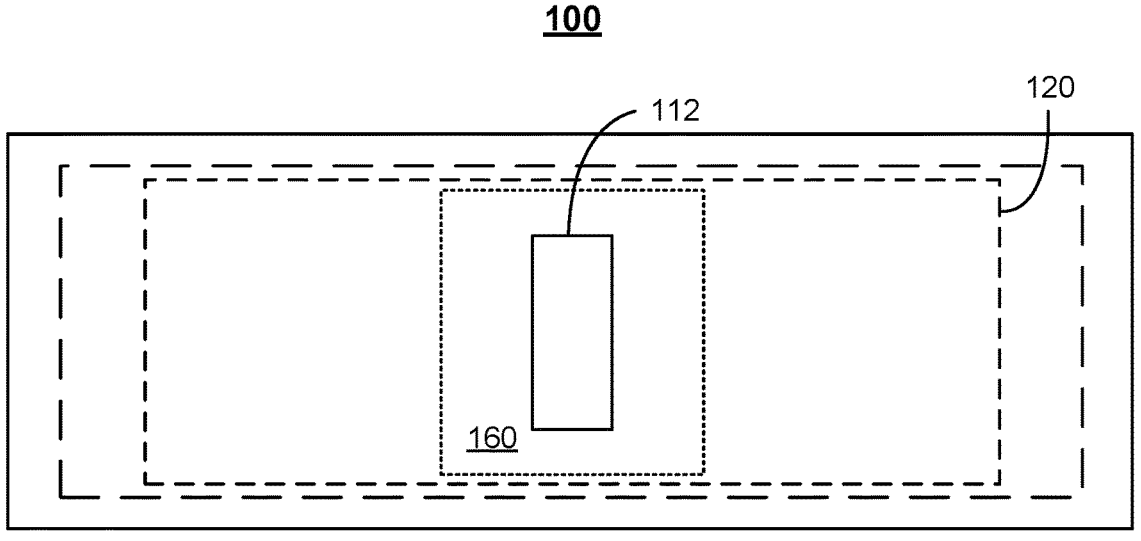
Figure 1C:
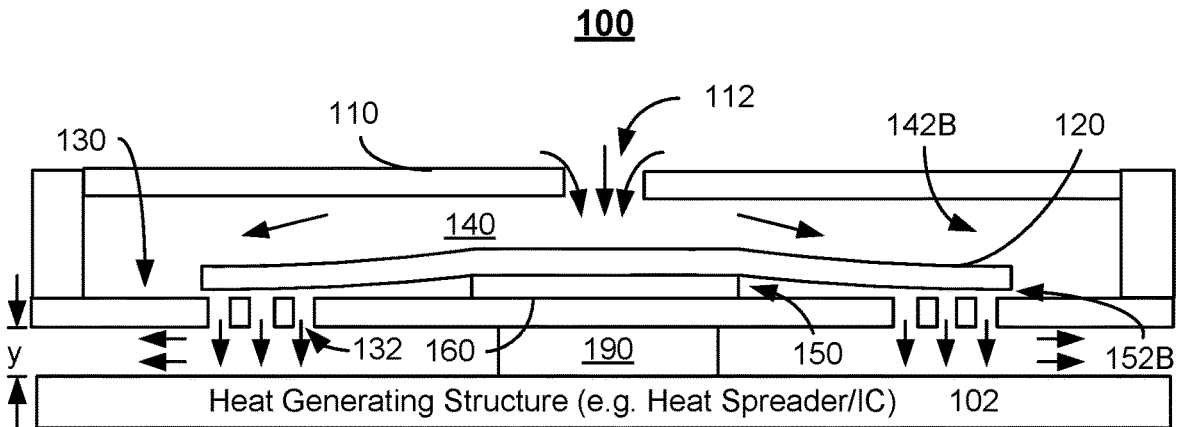
Figure 1D:
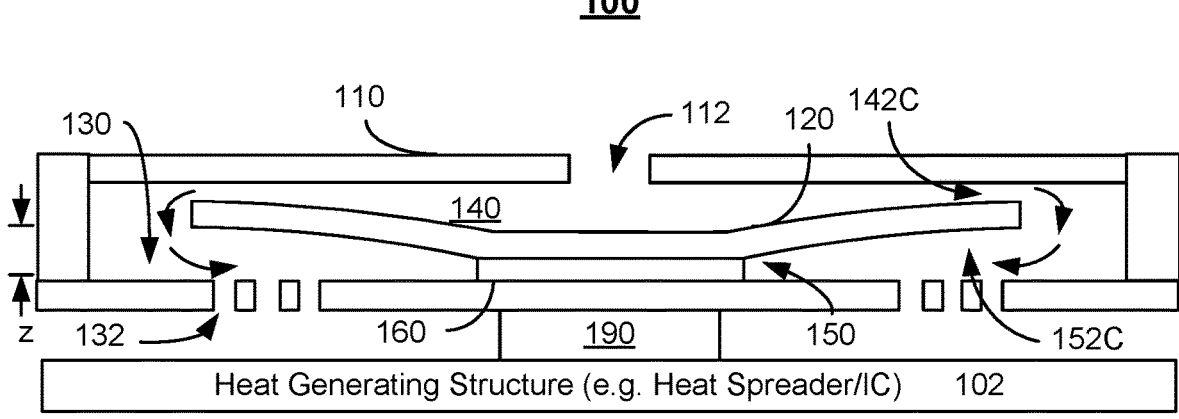
Figure 1E:
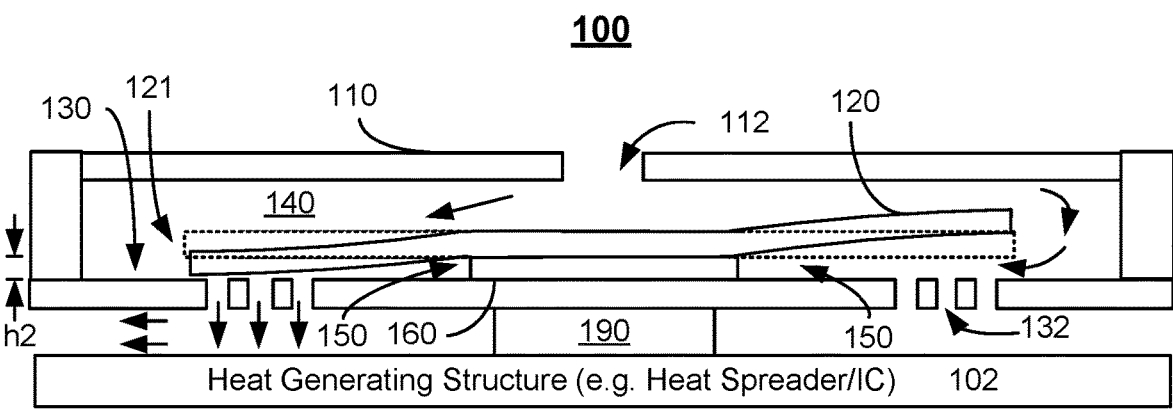
Figure 1F:
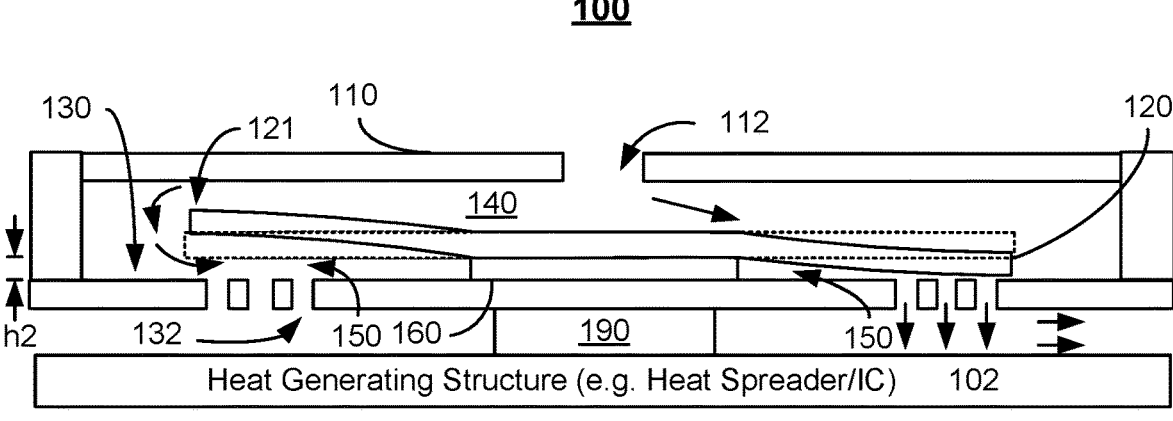
Figure 1G:
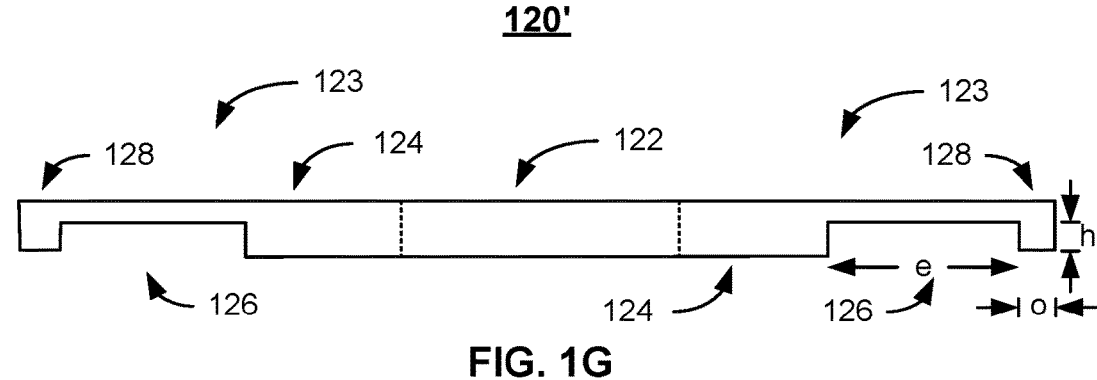

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS.

1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, an additional jet channel plate may be present and supported by pedestal 190. Thus orifice plate 130 and/or such a jet channel plate may be part or all of a bottom plate supported by pedestal 190. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 3 millimeters. In some embodiments, the total height of cooling system 100 is less than 2.5 millimeters. In some embodiments, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C = \lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. r1≥100 μm) and r2 is not more than one millimeter (e.g. r2≥1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D.

Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/ frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
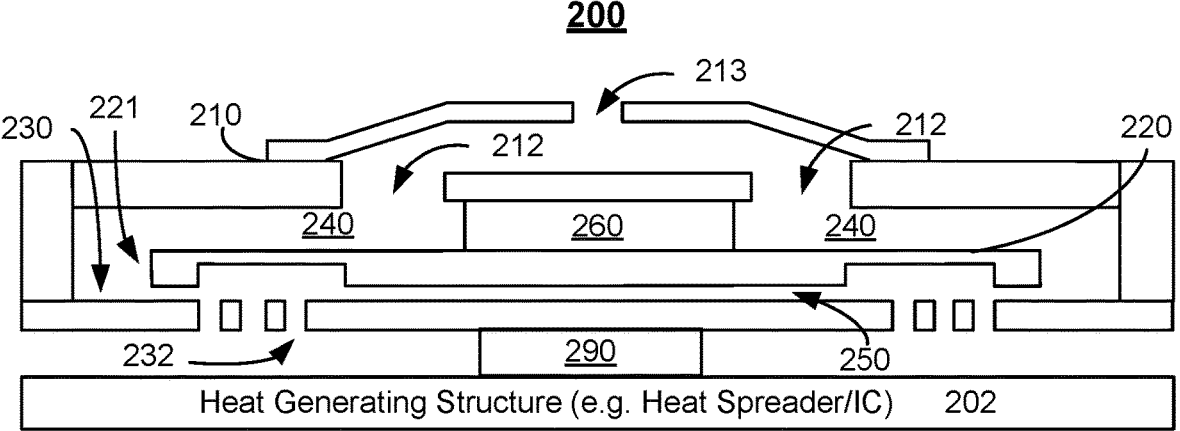
FIGS. 2A-2B depict an embodiment of an active MEMS cooling system including a centrally anchored cooling ele-ment.
Figure 2B:
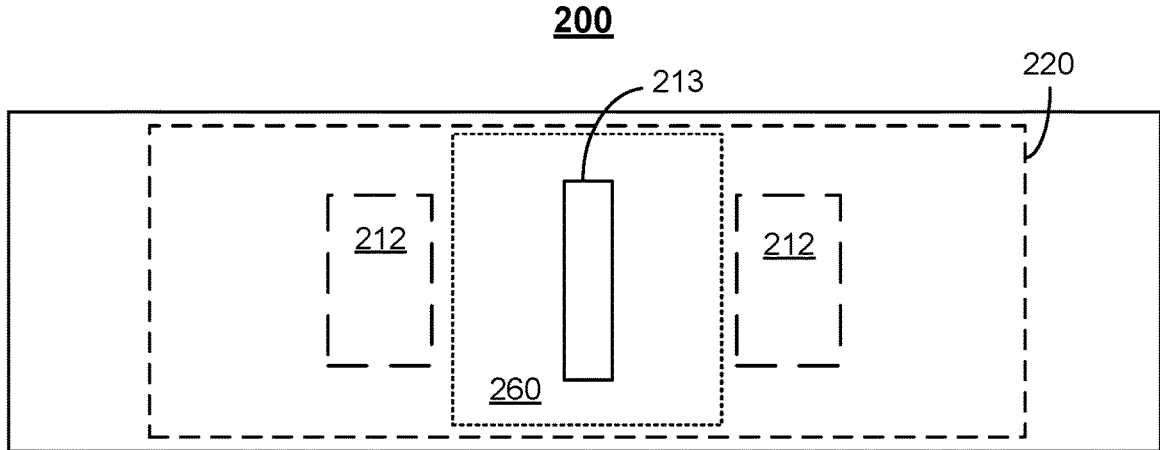

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
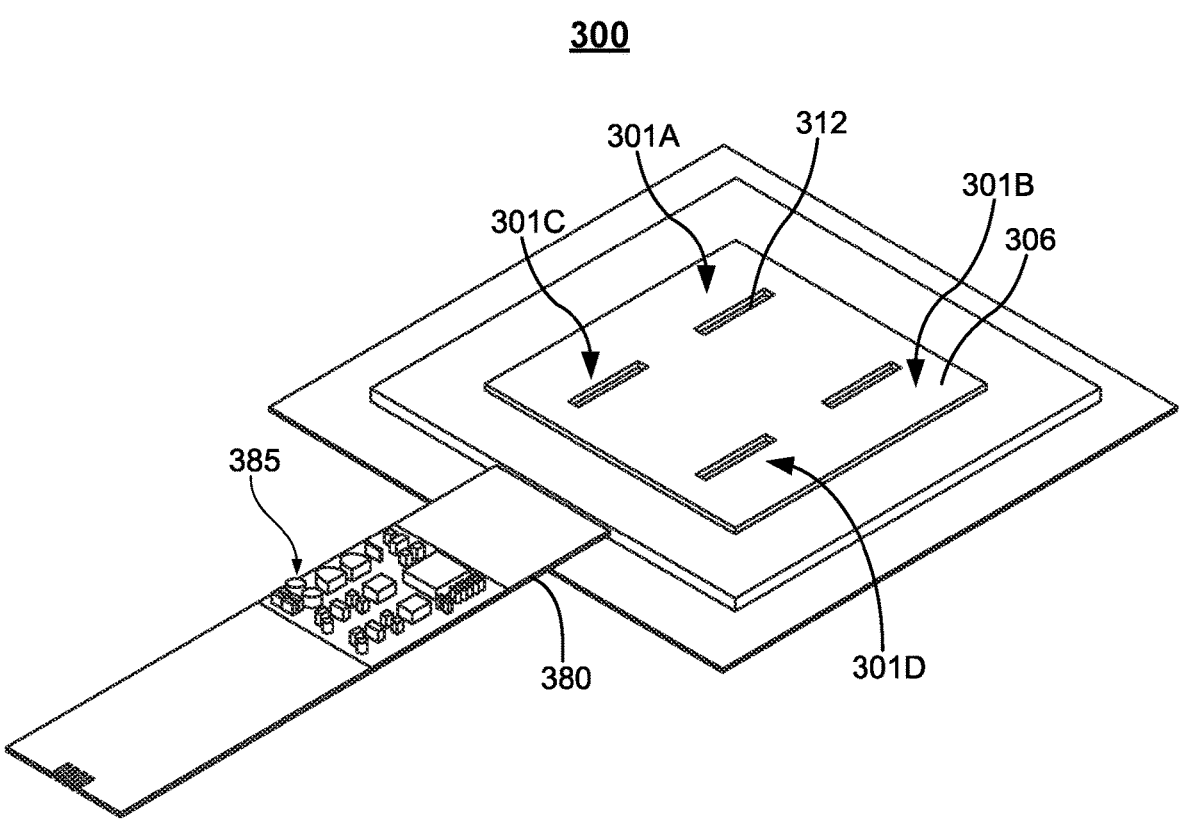
FIGS. 3A-3E depict an embodiment of an active MEMS cooling system formed in a tile.
Figure 3B:
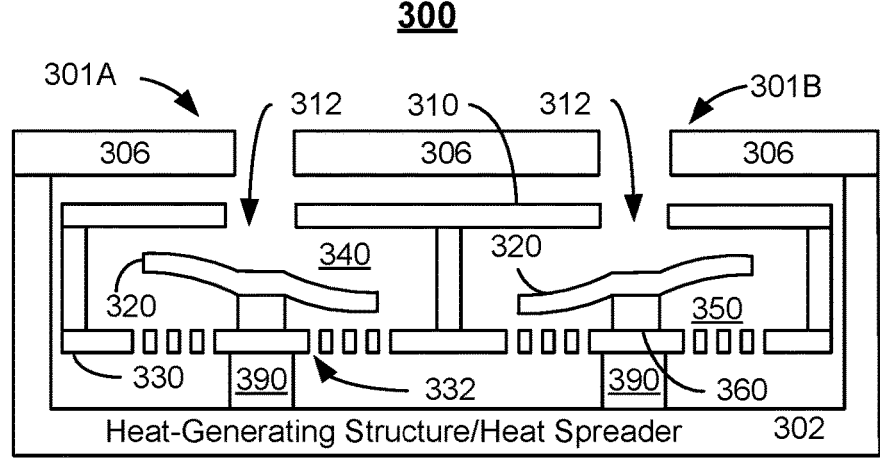
Figure 3C:
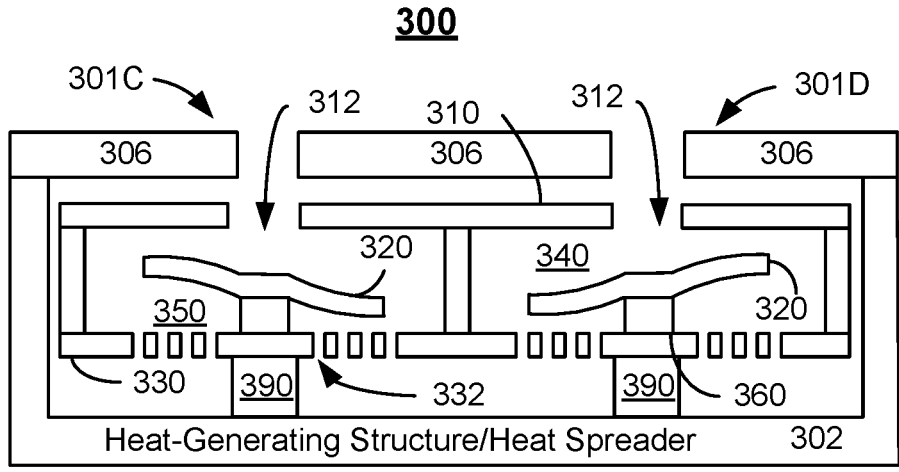
Figure 3D:
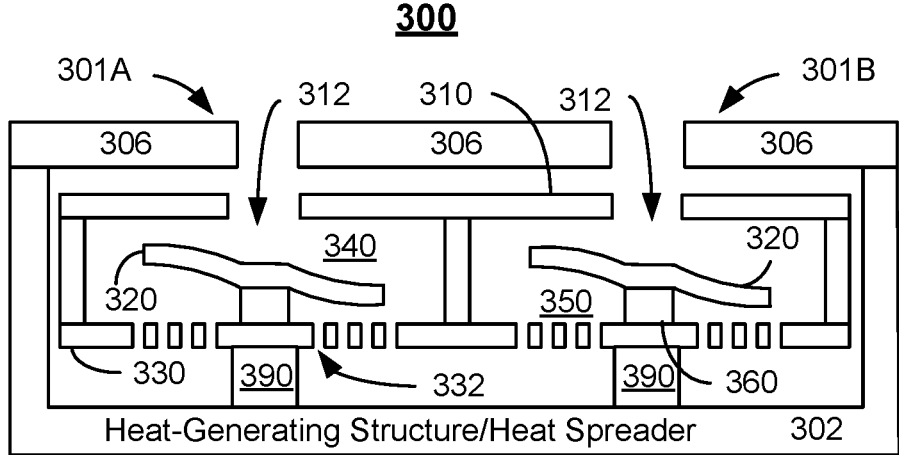
Figure 3E:
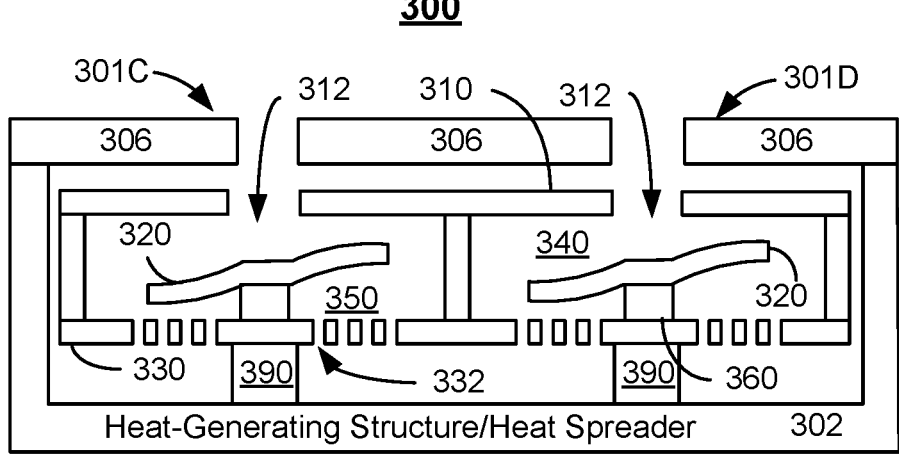

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figures 4A, 4B:
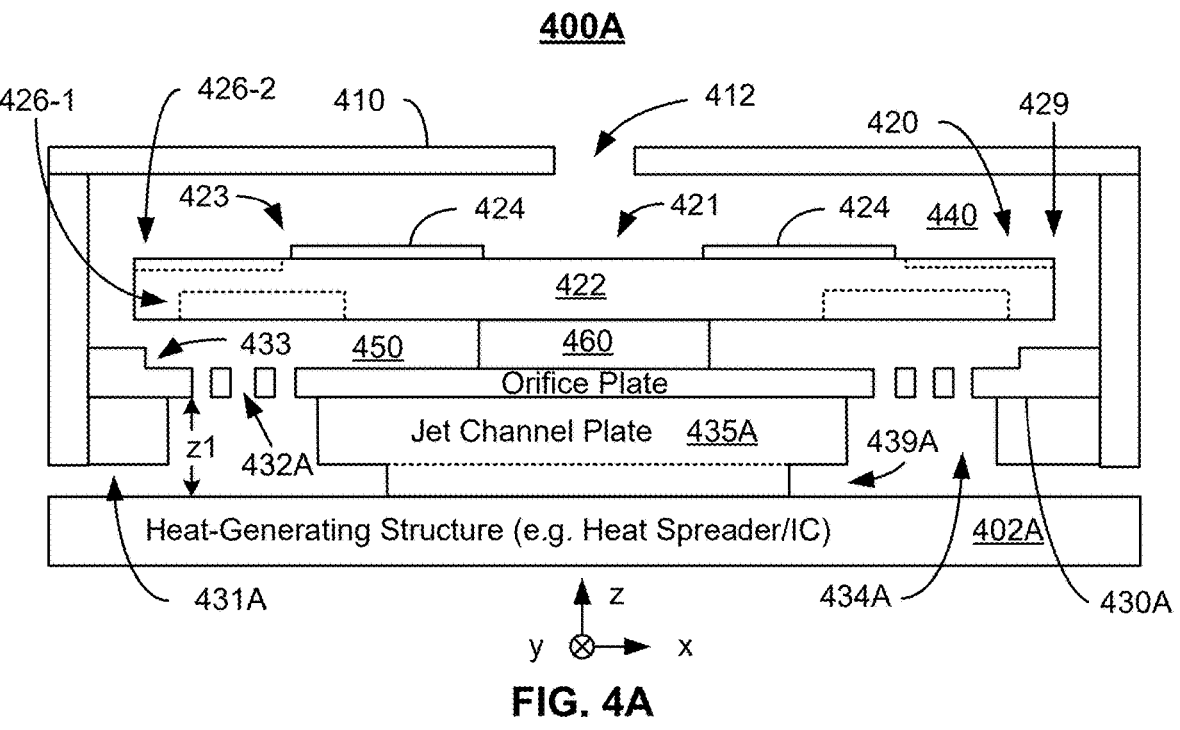
FIGS. 4A-4D depict embodiments of active MEMS cool-ing systems including centrally anchored cooling elements.

FIGS. 4A-4D depict embodiments of active MEMS cooling systems 400A, 400B, 400C, and 400D including a centrally anchored cooling element 420. FIGS. 4A and 4B are not to scale and for clarity, only some structures are shown. Cooling system(s) 400A, 400B, 400C, and/or 400D are analogous to cooling systems 100 and/or 200. Cooling system(s) 400A, 400B, 400C, and/or 400D may be cooling cell(s) that are part of a cooling system including multiple cells, such as tile 300. The device cooled by MEMS cooling system(s) 400A, 400B, 400C, and/or 400D may be a laptop computer, a tablet or notebook computer, a smart phone, and/or other mobile devices. The device may also be another device, such as a server in a rack, a game console, or a desktop computer. In some embodiments, therefore, the device is thin. For example, in some embodiments, the device in which cooling system(s) 400A, 400B, 400C, and/or 400D are integrated has a thickness (height along the smallest dimension, the z-direction in FIGS. 4A-4D) of not more than twenty-five millimeters. The thickness is not more than ten millimeters in some embodiments. In some such embodiments, the thickness of the device is not more than eight millimeters. However, other thicknesses are possible. Further, the total height of cooling systems 400A, 400B, 400C, and/or 400D (e.g. from the top of heat-generating structure to the top of top plate 410) may be less than three millimeters.

Each cooling system 400A, 400B, 400C, and/or 400D includes top plate 410 having vent(s) 412 therein, cooling element 420 having cantilevered arms 423 and tip 429, top chamber 440, bottom chamber 450, and anchor 460 that are analogous to top plate 110 having vent(s) 112 therein, cooling element 120', top chamber 140, bottom chamber 150, and anchor 160. Each cooling system 400A, 400B, 400C, and 400D operates in a manner analogous to cooling system 100, 200, and/or 300.

Cooling element 420 is centrally supported by anchor 460 such that at least a portion of the perimeter of cooling element 420 is free to vibrate. In the embodiment depicted, anchor 460 extends along the axis of cooling element 420 (i.e. along the y-direction). In other embodiments, anchor 460 is only near the center portion of cooling element 420. Although termed an "anchor," in some embodiments, anchor 460 may flex or rotate through small angles (e.g. less than one degree). Cooling element 420 includes actuator 422 and piezoelectrics 424. Piezoelectrics 424 are used to drive cooling element 420 to vibrate. In the embodiment shown, piezoelectrics 424 are on the upper surface (distal from bottom plate 430) of actuator 424. In some embodiments, piezoelectrics 424 may have another location and/or be integrated in another manner. Cooling element 420 may also be considered to be divided into an anchored region 421 and cantilevered arms 423. Cantilevered arms 423 of cooling element 420 may be driven in-phase. In some embodiments, cantilevered arms 423 of cooling element 420 are driven out-of-phase.

Actuator 422 may be formed of materials having a high acoustic velocity (e.g. greater than four thousand meters per second) and low internal losses (e.g. not more than 0.1 percent structural losses). Examples of materials that may be used for actuator 422 include stainless steel such as SUS304 and/or SUS316, Al7075, Al6063, Ti64, Ti Grade 2, Ti Grade 9, Monel, aluminum bronze, and/or aluminum. In some embodiments, the actuator consists of one or more of the low internal loss materials. In some embodiments, actuator 422 includes or consists of one or more of SUS304, SUS316, Al7075, Al6063, Ti64, Ti Grade 2, and Ti Grade 9. The use of such low loss materials may improve the efficiency of cooling systems 400A, 400B, 400C, and 400D.

Further, cooling element 420 (i.e. actuator 422 in the embodiments shown) has bottom cavity 426-1 and top cavity 426-2. Cavities 426-1 and 426-2 are indicated by dotted lines. In some embodiments, cavity 426-1 does not extend to the edges of cooling element 420. In some embodiments, cavity 426-1 extends to the edges of cooling element 420. In such embodiments, cooling element 420 may be analogous to cooling element 120'. In some embodiments, cavity 426-2 extends to the edges of cooling element 420. In other embodiments, cavity 426-2 does not extend to the edges of cooling element 420. In some embodiments, cavity 426-1 and/or 426-2 may be omitted. In some embodiments, another cooling element, including but not limited to a simple cooling element such as cooling element 120, may be used in lieu of cooling element 420.

Cooling systems 400A, 400B, 400C, and 400D include bottom plates 431A, 431B, 431C, and 431D. Bottom plates 431A, 431B, 431C, and 431D may include or be formed of compliant materials that may have low internal losses. The low internal losses are not more than 0.1 percent losses in some embodiments. The material(s) used for bottom plates 431A, 431B, 431C, and/or 431D may include at least one of Al7075, Al6063, Ti64 (Ti Grade 5), Ti Grade 2, Ti Grade 9, a beryllium-copper alloy, Monel, aluminum bronze, aluminum, SUS304, or SUS316.

Bottom plates 431A, 431B, 431C, and 431D each include orifice plate 430A, 430B, 430C, and 430D, respectively, and jet channel plate 435A, 435B, 435C, and 435D, respectively. In some embodiments, orifice plate(s) 430A, 430B, 430C, and 430D and jet channel plate(s) 435A, 435B, 435C, and 435D may be integrated into a single, monolithic bottom plate. Although depicted as part of jet channel plates 435A, 435B, 435C, and 435D, a pedestal (indicated by dotted lines in the central portion of each jet channel plate 435A, 435B, 435C, and 435D) may be a separate structure or may be omitted. In some embodiments, each orifice plate 430A, 430B, 430C, and 430D is at least two hundred micrometers thick and not more than four hundred micrometers thick (e.g. nominally three hundred micrometers thick). In some embodiments, each jet channel plate 435A, 435B, 435C, and 435D is at least six hundred micrometers thick and not more than eight hundred micrometers thick (e.g. nominally seven hundred micrometers thick).

Also shown are heat-generating structures 402A, 402B, 402C, and 402D. Heat-generating structure(s) 402A, 420B, 402C, and/or 402D may be a structure such as an integrated circuit that may generate heat and is desired to be cooled. More generally, heat-generating structures 402A, 420B, 402C, and/or 402D may be a heat spreader (e.g. heat spreader 302) or analogous structure that is thermally coupled to a structure that is desired to be cooled.

Referring to FIG. 4A, orifice plate 430A includes orifices 432A therein. Orifice plate 430A is analogous to orifice plate 130. Also shown in orifice plate 430A is edge 433. Thus, orifice plate 430A may be viewed as having a trench forming part of bottom cavity 450. Jet channel plate 435A includes cavities 434A therein. In some embodiments, each cavity 434A may have a width that is at least one-tenth and not more than three-eighths of the cooling cell width (e.g. width, C, depicted in FIG. 1A). For example, cavities 434A may have a width that is at least one-eighth and not more than three-eighths of the cooling cell width.

Orifice plate 430A and jet channel plate 435A are configured to set the distance between orifices 432A and the top surface of heat-generating structure 402A. For bottom plate 431A, orifices 432A are a distance z1 from the top of heat-generating structure 402A. The distance z1 is the thickness of jet channel plate 435A added to the height of gap 439A (also termed a jet channel herein) between jet channel plate 435A and heat-generating structure 402A.

Referring to FIG. 4B, jet channel plate 435B includes cavities 434B-1 therein. Cavities 434B-1 are analogous to cavities 434A. However, jet channel plate 435B also includes orifices 432B therein. Orifice plate 430B includes cavities 434B-2 therein. In the embodiment shown, cavities 434B-2 terminate at the top surface of jet channel plate 435B. In some embodiments, cavities 434B-2 extend into jet channel plate 435B. Thus, cavities 434B-1 are on a first side of orifices 432B, closer to heat-generating structure 402B. Cavities 434B-2 are on a second side of orifices 432B, further from heat-generating structure 402B. In some embodiments, each cavity 434B-1 and/or 434B-2 may have a width that is at least one-tenth and not more than three-eighths of the cooling cell width. For example, cavities 434B-1 and/or 434B-2 may have a width that is at least one-eighth and not more than three-eighths of the cooling cell width. In some embodiments, cavities 434B-1 and 434B-2 have the same width. In some embodiments, cavities 434B-1 and 434B-2 have different widths. Orifice plate 430B and jet channel plate 435B are configured to set the distance between orifices 432B and the top surface of heat-generating structure 402B. Orifices 432B are a distance, z2, equal to the height of gap 439B between jet channel plate 435B and heat-generating structure 402B added to the depth of cavities 434B-1. For bottom plate 431B, orifices 432B are a distance z2 ($z2 < z1$) from the top of heat-generating structure 402B.

Figure 4C:
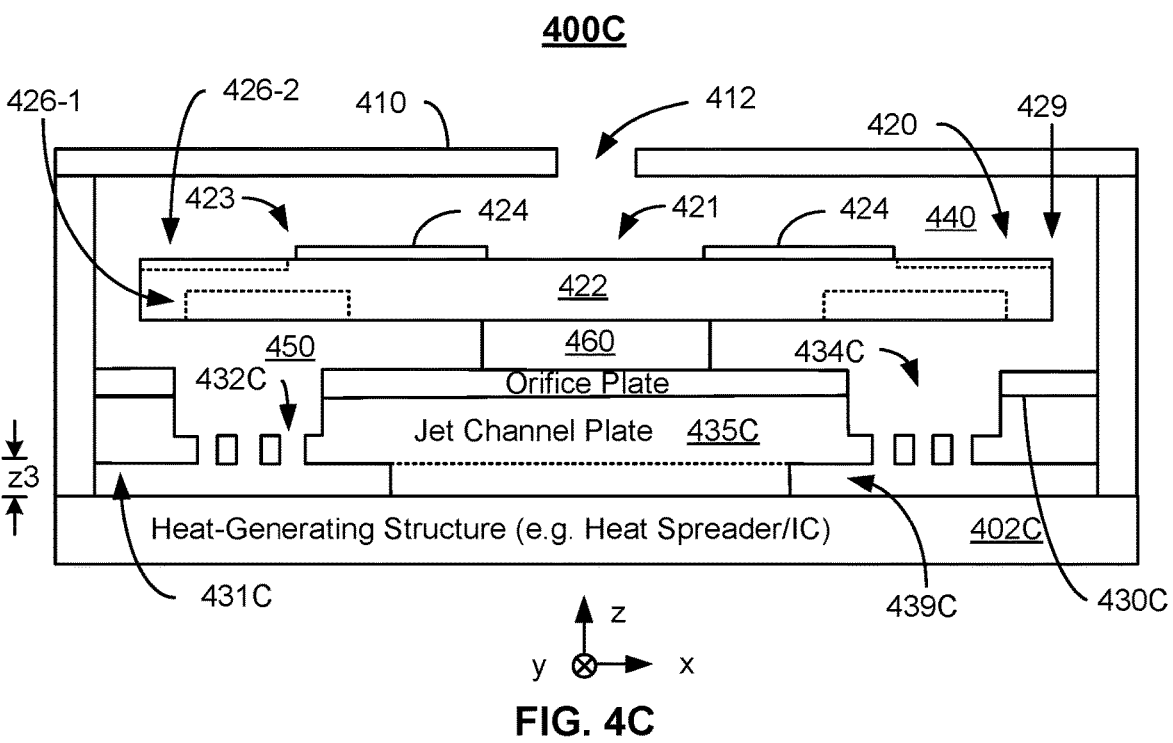

Referring to FIG. 4C, jet channel plate 435C includes orifices 432C therein. Cavities 434C extend through orifice plate 430C and partially through jet channel plate 435C. The portions of cavities 434C in orifice plate 430C are shown as having the same width as the portions of cavities 434C in jet channel plate 435C. In other embodiments, these portions of cavities 434C may have different widths. In some embodiments, cavities 434C may have a width that is at least one-tenth and not more than three-eighths of the cooling cell width. For example, cavities 434C may have a width that is at least one-eighth and not more than three-eighths of the cooling cell width. Orifice plate 430C and jet channel plate 435C are configured to set the distance between orifices 432C and the top surface of heat-generating structure 402C. For bottom plate 431C, orifices 432C are a distance z3 ($z3 < z2 < z1$) from the top of heat-generating structure 402C. This distance z3 is the height of gap 439C.

Figure 4D:
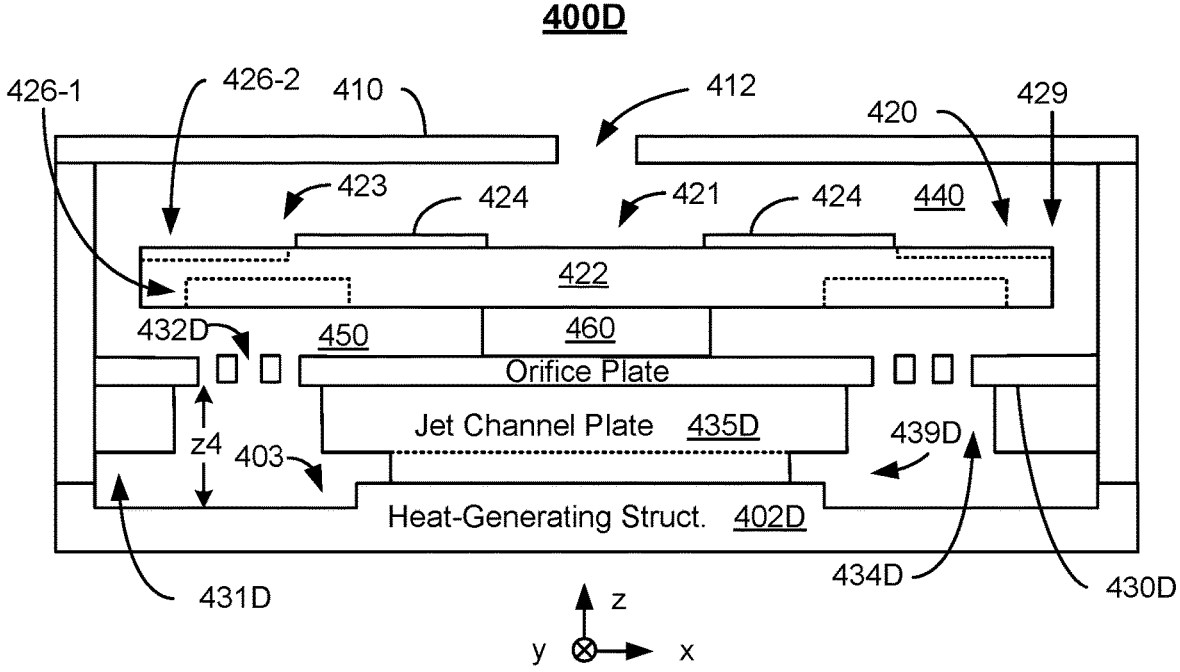

Referring to FIG. 4D, orifice plate 430D includes orifices 432D therein. Jet channel plate 435D includes cavities 434D. Thus, bottom plate 431D is analogous to bottom plate 431A. However, heat-generating structure 402D has depression 403 therein. Orifice plate 430D and jet channel plate 435D are configured to set the distance between orifices 432D and the top surface of heat-generating structure 402D. For bottom plate 431D, orifices 432D are a distance z4 ($z3 < z2 < z1 < z4$) from the top of heat-generating structure 402D.

By varying the configurations of bottom plates 431A, 431B, 431C, and 431D and/or heat-generating structures 402A, 402B, 402C, and 402D, the distance between orifices 432A, 432B, 432C, and 432D and the top surface of heat-generating structures 402A, 402B, 402C, and 402D (e.g. the portion of the surface substantially aligned with orifices 432A, 432B, 432C, and 432D may be varied. Changing the distance between the orifices in a cooling system and the heat-generating structure may be used to configure the flow and/or other characteristics of the cooling system. In some embodiments, the distance between the orifices and the heat-generating structure may be at least two hundred micrometers. However, other distances are possible. For example, the distance between the orifices and the heat-generating structure may be at least one hundred and fifty micrometers and not more than 1.5 millimeters. In some embodiments, the distance between the orifices and the heat-generating structure may be at least one hundred fifty and not more than four hundred micrometers (e.g. may be nominally at least two hundred micrometers and not more than three hundred micrometers). In some embodiments the distance between the orifices and the heat-generating structure may be at least five hundred micrometers and not more than one thousand micrometers (e.g. may be nominally 700 micrometers). In other embodiments, the distance between the orifices and the heat-generating structure may be at least eight hundred micrometers and not more than one thousand two hundred micrometers. Thus, configuration of the distances between orifices and heat-generating structures may be tailored.

Various distances between orifices 432A, 432B, 432C, and 432D and heat-generating structures 402A, 402B, 402C, and 402D are shown, for bottom plates 431A, 431B, 431C, and/or 431D. The lengths of orifices 432A, 432B, 432C, and 432D may also be varied. For example, orifices 432A may be lengthened by increasing the thickness of orifice plate 430A. The jet channel plate configuration may also be changed to replace cavities with orifices. However, bottom plates 431A, 431B, 431C, and 431D may have total thicknesses that are on the order of eight hundred micrometers or more. In such embodiments, it may be undesirable for orifices to extend entirely through the orifice plate. Stated differently, orifices 432A, 432B, 432C, and 432D have a length that is less than eight hundred micrometers. Orifices 432A, 432B, 432C, and 432D may have a length that is less than eight hundred micrometers. In some embodiments, the orifice length may be at least one hundred and fifty micrometers and not more than three hundred micrometers. In other embodiments, the orifice length may be at least fifty micrometers and not more than three hundred micrometers. In some embodiments, the orifice length may be at least seventy micrometers and not more than two hundred micrometers. In other embodiments, the orifice length may be at least one hundred micrometers and not more than one hundred and fifty micrometers. Such limitations on the lengths of orifices 432A, 432B, 432C, and 432D may prevent narrowing of the peak in flow around the resonant frequencies of cooling systems 400A, 400B, 400C, and 400D. Thus, performance of such cooling systems 400A, 400B, 400C, and/or 400D may be improved.

Figure 5A:
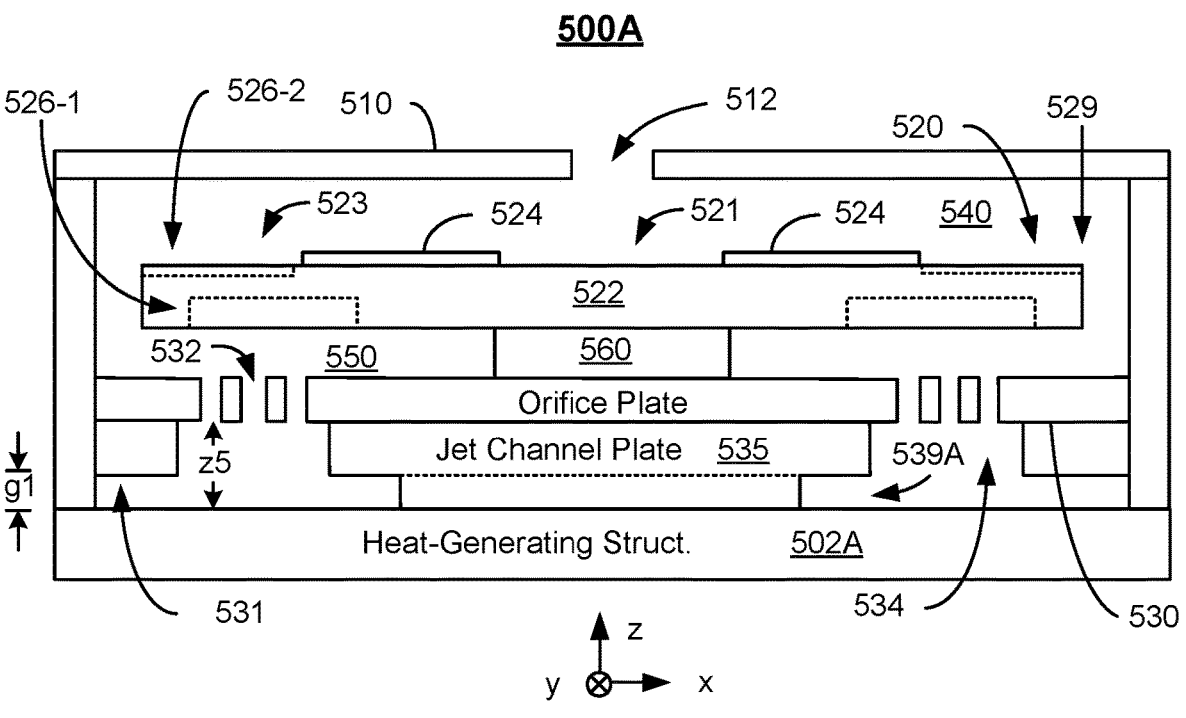
FIGS. 5A-5B depict embodiments of active MEMS cool-ing systems including centrally anchored cooling elements.
Figure 5B:
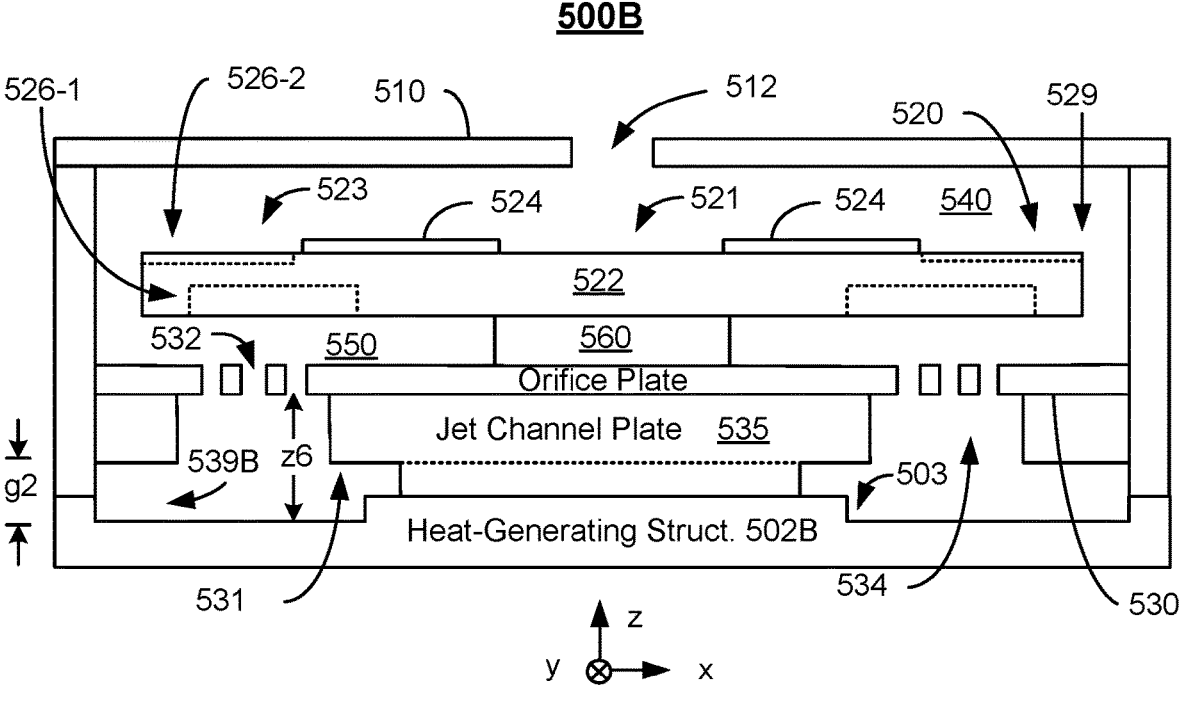

FIGS. 5A-5B depict embodiments of active MEMS cooling systems 500A and 500B including a centrally anchored cooling elements 520. FIGS. 5A and 5B are not to scale and for clarity, only some structures are shown. Cooling system(s) 500A and/or 500B may be cooling cell(s) that are part of a cooling system including multiple cells, such as tile 300. The device cooled by MEMS cooling system(s) 500A and/or 500B may be a laptop computer, a tablet or notebook computer, a smart phone, and/or other mobile devices. The device may also be another device, such as a server in a rack, a game console, or a desktop computer. In some embodiments, therefore, the device is thin. For example, in some embodiments, the device in which cooling system(s) 500A and/or 500B are integrated has a thickness (height along the smallest dimension, the z-direction in FIGS. 5A-5D) of not more than twenty-five millimeters. The thickness is not more than ten millimeters in some embodiments. In some such embodiments, the thickness of the device is not more than eight millimeters. However, other thicknesses are possible. Further, the total height of cooling system(s) 500A and/or

500B (e.g. from the top of heat-generating structures 502A and/or 502B to the top of top plate 510) may be less than three millimeters.

Cooling system(s) 500A and/or 500B are analogous to cooling systems 400A, 400B, 400C, 400D, 100, and 200. Each cooling system 500A and/or 500B includes top plate 510 having vent(s) 512 therein, cooling element 520 having cantilevered arms 523, top chamber 540, bottom chamber 550, and anchor 560 that are analogous to top plate 410/110 having vent(s) 412/112 therein, cooling element 420/120', top chamber 440/140, bottom chamber 450/150, and anchor 460/160. Cooling element 520 has tip 529 and includes actuator 522 and piezoelectrics 524 that are analogous to tip 429, actuator 422, and piezoelectrics 424. Cooling element 520 may also be considered to be divided into anchored region 521 and cantilevered arms 523 that are analogous to anchored region 421 and cantilevered arms 423. Cantilevered arms 523 may include cavities 526-1 and/or 526-2 that are analogous to cavities 426-1 and/or 426-2. Cantilevered arms 523 of cooling element 520 may be driven in-phase. In some embodiments, cantilevered arms 523 of cooling element 520 are driven out-of-phase. Further, the materials used for actuator 522 are analogous to those used for actuator 422 of cooling systems 400A, 400B, 400C, and/or 400D. Each cooling system 500A and 500B operates in a manner analogous to cooling system(s) 100, 200, 300, and/or 400.

Cooling system(s) 500A and 500B also include bottom plates 531 that are analogous to bottom plates 431A, 431B, 431C, and/or 431D. Bottom plate 531 includes orifice plate 530 and jet channel plate 535 that are analogous to orifices plates 430A, 430B, 430C, and/or 430D and jet channel plates 435A, 435B, 435C, and/or 435D, respectively. Thus, jet channel plate 535 includes cavities 534 that are analogous to cavities 434A and 434D. In some embodiments, cavities 434B-1, 434B-2, and/or 434C may be present. Further, the materials used for bottom plates 531, orifice plates 530, and/or jet channel plates 535 are analogous to those used for the bottom plates, orifice plates, and/or jet channel plates of cooling systems 400A, 400B, 400C, and/or 400D.

Also shown are heat-generating structures 502A and 502B. Heat-generating structures 502A and/or 502B may be structures such as an integrated circuit that may generate heat and are desired to be cooled. More generally, heat-generating structures 502A and/or 502B may be heat spreaders (e.g. heat spreader 302) or analogous structures that are thermally coupled to a structure that is desired to be cooled. Heat-generating structure 502A is analogous to heat-generating structures 402A, 402B, and/or 402C. Heat-generating structure 502B is analogous to heat-generating structure 402D. Thus, heat-generating structure 502B has depression 503, which is analogous to depression 403.

Cooling system 500A is configured such that gap 539A is between the bottom of jet channel plate 535 and the top of heat-generating structure 502A. Gap 539A has height gl. Cooling system 500B is configured such that gap 539B is between the bottom of jet channel plate 535 and heat-generating structure 502B. Gaps 539A and/or 539B may be configured by changing the depths of depression 503, the height of the pedestal portion of jet channel plate 535, the manner in which jet channel plate 535 is connected with heat-generating structure 502A and/or 502B, and/or using another mechanism.

It has been determined that the deflection of actuator 522 for a given driving voltage is generally lower for the heights of gaps 539A and/or 539B decreasing toward zero and increasing for larger heights of gaps 539A and/or 539B up to particular heights. Thus, for a particular gap height range, actuator deflection and thus the flow of fluid through cooling systems 500A and 500B may be higher. In some embodiments, the gap height (e.g. g1 and/or g2) is at least one hundred micrometers and not more than six hundred micrometers. In some embodiments, the gap height is at least two hundred and not more than five hundred micrometers. For example, gap(s) 539A and/or 539B may be at least three hundred and not more than five hundred micrometers height. In some embodiments, gap(s) 539A and/or 539B is desired to be at least three hundred and fifty and not more than four hundred and fifty micrometers. Such an arrangement may have improved flow and, therefore, improved cooling efficiency. It is believed that the improvement in flow in this regime is due to an improved matching between the mechanical and acoustic resonance characteristics of the cooling cell. Consequently, gaps 539A and/or 539B between cooling system 500A and/or 500B (e.g. the distance between jet channel plate 535 and heat-generating structure 502A and/or 502B) and heat spreader 502A and/or 502B may be tailored for improved performance.

Cooling systems 400A, 400B, 400C, 400D, 500A, and 500B are described in the context of various features. The features of cooling systems 400A, 400B, 400C, 400D, 500A, and/or 500B may be combined in various ways not explicitly depicted. For example, orifices having different distances to the heat-generating structures may be combined with a differently configured orifice plate and/or a heat-generating structure having trenches therein.

Figure 6:
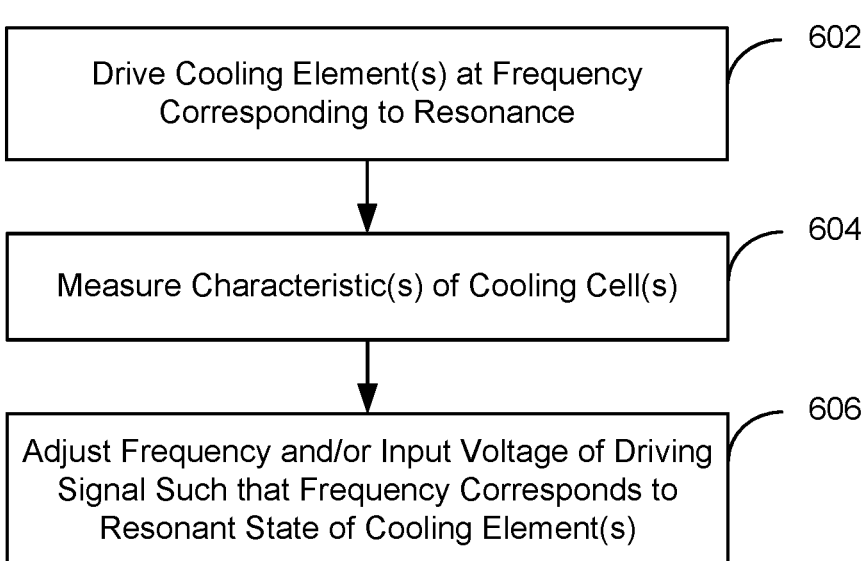
FIG. 6 depicts an embodiment of a method for using an active cooling mems system.

FIG. 6 depicts an embodiment of method 600 for using an active cooling system. Method 600 may include steps that are not depicted for simplicity. Method 600 is described in the context of system 400. However, method 600 may be used with other cooling systems including but not limited to systems and cells described herein.

A driving signal at a frequency and an input voltage corresponding to the resonant state of one or more cooling elements is provided to the active MEMS cooling system, at 602. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above.

Characteristic(s) of the MEMS cooling system are monitored while the cooling element(s) are driven to provide a feedback signal corresponding to a proximity to a resonant state of the cooling element(s), at 604. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 604. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the at cooling element, average voltage at the at least one cooling element, and/or the peak current drawn by the cooling element may be monitored. Using the characteristic(s) monitored, a deviation from the resonant state of the cooling element (e.g. of the driving/vibration frequency the deviation from the resonant frequency) may be determined.

The frequency and/or input voltage is adjusted based on the feedback signal, at 606. More specifically, 606 includes updating the frequency and/or input voltage, based on the feedback signal, to correspond to resonant state(s) of the cooling element(s) at 606. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 606 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling element 420 in MEMS cooling system 400A is driven, at 602. Thus, the cooling element 420 is driven at a frequency that is at or near resonance of the cooling element. Characteristics of cooling element 420 within MEMS cooling system 400A are monitored, at 604. Thus, the drift of the cooling element(s) 420 from resonance may be determined. The frequency may be adjusted based on the monitoring of 604, at 606. Thus, MEMS cooling systems 400A, 400B, 400C, and/or 400D may be kept at or near resonance.

Thus, using method 600, an active cooling system, such as cooling system(s) 100, 200, 300, 400A, 400B, 400C, 400D, 500A, and/or 500B using cooling elements 120, 120', 220, 320, 420, and/or 520 may be efficiently driven. These cooling systems may also have improved performance due to the configuration(s) of the bottom plate (e.g. orifice plate and/or jet channel plate), the heat-generating structure, the spacing between the orifices and the heat-generating structure, the lengths of orifices, and/or the spacing between the bottom plate and the heat-generating structure. Thus, such cooling system may have further improved efficiency and/or reliability. Thus, method 600 may be used to operate active MEMS cooling systems and achieve the benefits described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
a support structure;
a cooling element having a central region and a perimeter, the cooling element being supported by the support structure at the central region, at least a portion of the perimeter being unpinned such that the cooling element includes at least one cantilevered arm, the at least one cantilevered arm of the cooling element being config-
ured to undergo vibrational motion when actuated to
drive a fluid for cooling a heat-generating structure; and
a bottom plate having a plurality of orifices and at least
one cavity therein, the at least one cavity being adjacent
to and fluidically connected with the plurality of ori-
fices, a gap being between a first portion of the bottom
plate and a portion of the heat-generating structure, the
gap and at least one of the plurality of orifices or the at
least one cavity defining an orifice distance between a
second portion of the bottom plate adjoining an orifice
of the plurality of orifices and the heat-generating
structure and an orifice length for the orifice within the
bottom plate.

2. The cooling system of claim 1, wherein the at least one
cavity includes at least one of a first cavity on a first side of
the plurality of orifices or a second cavity on a second side
of the plurality of orifices, the first cavity being further from
the heat-generating structure than the plurality of orifices,
the second cavity being closer to the heat-generating struc-
ture than the plurality of orifices.

3. The cooling system of claim 1, wherein the orifice
distance is at least two hundred micrometers and wherein the
orifice length of at least one hundred and fifty micrometers
and not more than three hundred micrometers.

4. The cooling system of claim 1, wherein the gap is at
least two hundred microns and not more than five hundred
microns high.

5. The cooling system of claim 4, wherein the gap is at
least three hundred and fifty microns and not more than four
hundred and fifty hundred microns high.

6. The cooling system of claim 1, wherein the bottom
plate includes a material having low internal losses.

7. The cooling system of claim 6, wherein the material
includes at least one of Al7075, Al6063, Ti64, Ti Grade 2, Ti
Grade 9, a beryllium-copper alloy, Monel, aluminum
bronze, aluminum, SUS 304, or SUS316.

8. The cooling system of claim 1, wherein the bottom
plate includes an orifice plate and a jet channel plate, the jet
channel plate being between the orifice plate and the heat-
generating structure.

9. The cooling system of claim 1, wherein the heat-
generating structure has a depression therein and wherein
the orifice distance includes a height of the depression.

10. A cooling system, comprising:
a plurality of cooling cells, each of the plurality of cooling
cells including a bottom plate, a support structure, and
a cooling element, the cooling element having a central
region and a perimeter, the cooling element being
supported by the support structure at the central region,
at least a portion of the perimeter being unpinned such
that the cooling element includes at least one cantile-
vered arm, the at least one cantilevered arm of the
cooling element being configured to undergo vibra-
tional motion when actuated to drive a fluid for cooling
a heat-generating structure, the bottom plate having a
plurality of orifices and at least one cavity therein, the
at least one cavity being adjacent to and fluidically
connected with the plurality of orifices, a gap being
between a first portion of the bottom plate and a portion
of the heat-generating structure, the gap and at least one
of the plurality of orifices or the at least one cavity
defining an orifice distance between a second portion of
the bottom plate adjoining an orifice of the plurality of orifices and the heat-generating structure and an orifice
length for the orifice within the bottom plate.

11. The cooling system of claim 10, wherein the bottom
plate is part of a single integrated bottom plate for the
plurality of cooling cells.

12. The cooling system of claim 10, wherein the at least
one cavity includes at least one of a first cavity on a first side
of the plurality of orifices or a second cavity on a second side
of the plurality of orifices, the first cavity being further from
the heat-generating structure than the plurality of orifices,
the second cavity being closer to the heat-generating struc-
ture than the plurality of orifices.

13. The cooling system of claim 10, wherein the orifice
distance is at least two hundred micrometers and wherein the
orifice length of at least one hundred and fifty micrometers
and not more than three hundred micrometers.

14. The cooling system of claim 10, wherein the gap is at
least three hundred microns and not more than five hundred
microns high.

15. The cooling system of claim 10, wherein the bottom
plate includes a material having low internal losses, the
material including at least one of Al7075, Al6063, Ti64, Ti
Grade 2, Ti Grade 9, a beryllium-copper alloy, Monel,
aluminum bronze, aluminum, SUS 304, or SUS316.

16. The cooling system of claim 10, wherein the bottom
plate includes an orifice plate and a jet channel plate, the jet
channel plate being between the orifice plate and the heat-
generating structure.

17. The cooling system of claim 10, wherein the heat-
generating structure has a depression therein and wherein
the orifice distance includes a height of the depression.

18. A method of cooling a heat-generating structure,
comprising:
driving a cooling element to induce a vibrational motion
at a frequency, the cooling element being part of a
cooling cell, the cooling cell including a support struc-
ture, the cooling element and a bottom plate, the
cooling element having a central region and a perim-
eter, the cooling element being supported by the sup-
port structure at the central region, at least a portion of
the perimeter being unpinned such that the cooling
element includes at least one cantilevered arm, the at
least one cantilevered arm of the cooling element being
configured to undergo vibrational motion when actu-
ated to drive a fluid for cooling the heat-generating
structure, the bottom plate having a plurality of orifices
and at least one cavity therein, the at least one cavity
being adjacent to and fluidically connected with the
plurality of orifices, a gap being between a first portion
of the bottom plate and a portion of the heat-generating
structure, the gap and at least one of the plurality of
orifices or the at least one cavity defining an orifice
distance between a second portion of the bottom plate
adjoining an orifice of the plurality of orifices and the
heat-generating structure and an orifice length for the
orifice within the bottom plate.

19. The method of claim 18, wherein the orifice distance
is at least two hundred micrometers and wherein the orifice
length of at least one hundred and fifty micrometers and not
more than three hundred micrometers.

20. The method of claim 18, wherein the gap is at least
two hundred microns and not more than five hundred
microns high.

* * * * *